(12) United States Patent
Hu

(10) Patent No.: US 9,947,412 B1
(45) Date of Patent: Apr. 17, 2018

(54) DATA WRITING METHOD, MEMORY CONTROL CIRCUIT UNIT AND MEMORY STORAGE APPARATUS

(71) Applicant: PHISON ELECTRONICS CORP., Miaoli (TW)

(72) Inventor: Chun-Yang Hu, Taoyuan (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/603,427

(22) Filed: May 23, 2017

(30) Foreign Application Priority Data

Mar. 28, 2017 (TW) .............................. 106110328 A

(51) Int. Cl.
| | |
|---|---|
| *G11C 16/04* | (2006.01) |
| *G11C 16/14* | (2006.01) |
| *G11C 16/26* | (2006.01) |
| *G11C 16/08* | (2006.01) |
| *G11C 11/56* | (2006.01) |

(52) U.S. Cl.
CPC .......... *G11C 16/14* (2013.01); *G11C 11/5635* (2013.01); *G11C 11/5642* (2013.01); *G11C 16/08* (2013.01); *G11C 16/26* (2013.01)

(58) Field of Classification Search
CPC ......... G11C 16/14; G11C 16/08; G11C 16/26; G11C 11/5635; G11C 11/5642
See application file for complete search history.

(56) References Cited

U.S. PATENT DOCUMENTS

| | | | | |
|---|---|---|---|---|
| 8,286,005 | B2* | 10/2012 | Matsuda | G06F 21/78 |
| | | | | 713/194 |
| 9,430,327 | B2* | 8/2016 | Yeh | G11C 29/52 |
| 9,646,178 | B2* | 5/2017 | Kan | G06F 21/79 |
| 9,665,481 | B2* | 5/2017 | Tan | G06F 12/0246 |

* cited by examiner

*Primary Examiner* — Pho M Luu
(74) *Attorney, Agent, or Firm* — JCIPRNET

(57) ABSTRACT

A data writing method for a rewritable non-volatile memory module is provided. The method includes recording a plurality of characteristic parameters corresponding to a plurality of data to be programmed; arranging the data according to the characteristic parameters and identifying frequently-read data among the plurality of data according to the characteristic parameters, and programming the frequently-read data into a first physical programming unit of a rewritable non-volatile memory module, wherein a time for reading data from the first physical programming unit is less than a time for reading data from a second physical programming unit of the rewritable non-volatile memory module. Accordingly, the reading performance for the data can be effectively improved.

27 Claims, 10 Drawing Sheets

| Lower physical programming unit | Middle physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

901

| Logical address | LA0 | LA1 | LA2 | LA3 | LA4 | LA5 | · · · |
|---|---|---|---|---|---|---|---|
| Read count | 0 | 5 | 300 | 10 | 20 | 10 | · · · |

| 0 | D2 | ~ 410(F) |
|---|---|---|
| 1 | D3 | |
| 2 | D0 | |
| 3 | D4 | |
| 4 | D5 | |
| 5 | D1 | |
| 6 | | |
| ⋮ | ⋮ | |

FIG. 10

DATA WRITING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 106110328, filed on Mar. 28, 2017. The entirety of the above-mentioned patent application is hereby incorporated by reference herein and made a part of this specification.

BACKGROUND

Technical Field

The invention relates to a data writing method for a rewritable non-volatile memory module, and a memory control circuit unit and a memory storage apparatus using the same.

Description of Related Art

The growth of digital cameras, mobile phones, and MP3 players has been rapid in recent years. Consequently, the consumers' demand for storage media has increased tremendously. A rewritable non-volatile memory is one of the most adaptable memories for portable electronic products such as laptop computer due to its data non-volatility, low power consumption, small volume, non-mechanical structure and high read/write speed. A solid state drive (SSD) is a memory storage apparatus which utilizes a flash memory module as a storage medium. For these reasons, flash memory industries become an import part of the electronic industries in recent years.

In an NAND flash memory module, physical programming units are constituted by a plurality of memory cells arranged on the same word line. Based on memorable bits of each memory cell, the NAND flash memory module may be classified into a Single Level Cell (SLC) NAND flash memory module, a Multi Level Cell (MLC) NAND flash memory module and a Trinary Level Cell (TLC) NAND flash memory module. Among them, each memory cell of the SLC NAND flash memory module can store data of one bit (i.e., and "0"), each memory cell of the MLC NAND flash memory module can store data of two bits, and each memory cell of the TLC NAND flash memory module can store data of three bits.

Because each memory cell of the SLC NAND flash memory module can store data of one bit, the memory cells arranged on the same word line correspond to one physical programming unit in the SLC NAND flash memory module.

Compared to the SLC NAND flash memory module, a floating gate storage layer of each memory cell of the MLC NAND flash memory module can store data of two bits. In this case, each storage state (i.e., "11", "10", "01" and "00") includes a LSB (Least Significant Bit) and a MSB (Most Significant Bit). For example, in a storage state, the value of a first bit counted from the left is the LSB, and the value of a second bit counted from the left is the MSB. Accordingly, the memory cells arranged on the same word line can constitute two physical programming units. Here, the physical programming unit constituted by the LSBs of said memory cells is known as a lower physical programming unit, and the physical programming unit constituted by the MSBs of said memory cells is known as an upper physical programming unit. In particular, data stored in the lower physical programming unit may be lost due to errors occurred when the upper physical programming unit is being programmed.

Similarly, each memory cell in the TLC NAND flash memory module can store data of three bits. In this case, each storage state (i.e., "111" "110", "101" "100", "011", "010", "001" and "000") includes the LSB as a first bit counted from the left, a CSB (Center Significant Bit) as a second bit counted from the left and the MSB as a third bit counted from the left. Accordingly, the memory cells arranged on the same word line can constitute three physical programming units. Here, the physical programming unit constituted by the LSBs of said memory cells is known as a lower physical programming unit, the physical programming unit constituted by the CSBs of said memory cells is known as a middle physical programming unit, and the physical programming unit constituted by the MSBs of said memory cells is known as an upper physical programming unit. In particular, to ensure that data can be stably stored on one specific word line in the TLC NAND flash memory module, that specific word line must be programmed three times. For example, after the memory cells on a first word line is programmed for the first time, the memory cells on the first word line are in a first state. The memory cells on the first word line are again programmed at the same time when the memory cells on a second word line are programmed. At this time, the memory cells on the first word line are in a foggy state. Then, the memory cells on the first and second word lines are again programmed at the same time when the memory cells on a third word line are programmed. At this time, the memory cells on the first word line are in a fine state. Further, the memory cells on the second and third word lines are again programmed at the same time when the memory cells on a fourth word line are programmed. At this time, the memory cells on the second word line are in the fine state. In this way, it can be ensured that the data in the memory cells on the first word line are stably stored.

As the number of bits storable by each memory cell increases, a time for identifying the storage state of each memory cell will also increase. Therefore, finding a way to effectively improve efficiency for executing read commands and shorten a time for reading data is one of the major subjects to be addressed by persons skilled in the art.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The invention is directed to a data writing method, a memory control circuit unit and a memory storage apparatus, which are capable of effectively improving a reading performance of a rewritable non-volatile memory module.

An exemplary embodiment of the invention proposes a data writing method for a rewritable non-volatile memory module. The rewritable non-volatile memory module has a plurality of physical erasing units. Each physical erasing unit among the physical erasing units has a plurality of physical programming units. The physical programming units are at least classified into a first physical programming unit and a second physical programming unit, and a time for reading data from the first physical programming unit is less than a time for reading data from the second physical programming unit. The data writing method includes: recording a plurality of characteristic parameters corresponding to multiple data; identifying first data among the plurality of data as frequently-read data according to the characteristic parameters; and programming the first data into the first physical programming unit of a first physical erasing unit among the physical erasing units.

An exemplary embodiment of the invention proposes a memory control circuit unit, which includes a host system, a memory interface and a memory management circuit. The host interface is configured to couple to a host system. The memory interface is configured to couple to the rewritable non-volatile memory module. The rewritable non-volatile memory module has a plurality of physical erasing units. Each physical erasing unit among the physical erasing units has a plurality of physical programming units. The physical programming units are at least classified into a first physical programming unit and a second physical programming unit, and a time for reading data from the first physical programming unit is less than a time for reading data from the second physical programming unit. The memory management circuit is coupled to the host interface and the memory interface, and configured to record a plurality of characteristic parameters corresponding to a plurality of data and identify first data among the plurality of data as frequently-read data according to the characteristic parameters. In addition, the memory management circuit is further configured to give a command sequence for programming the first data into the first physical programming unit of a first physical erasing unit among the physical erasing units.

An exemplary embodiment of the invention proposes a memory storage apparatus, which includes a connection interface unit, a rewritable non-volatile memory module and a memory control circuit unit. The connection interface unit is configured to couple to a host system. The rewritable non-volatile memory module includes a plurality of physical erasing units. Each physical erasing unit among the physical erasing units has a plurality of physical programming units. The physical programming units are at least classified into a first physical programming unit and a second physical programming unit, and a time for reading data from the first physical programming unit is less than a time for reading data from the second physical programming unit. The memory control circuit unit is coupled to the connection interface unit and the rewritable non-volatile memory module, and configured to record a plurality of characteristic parameters corresponding to a plurality of data and identify first data among the plurality of data as frequently-read data according to the characteristic parameters. In addition, the memory control circuit unit is further configured to program the first data into the first physical programming unit of a first physical erasing unit among the physical erasing units.

Based on the above, with the data writing method, the memory control circuit unit and the memory storage apparatus described in the exemplary embodiments, a sequence for writing data is arranged according to the characteristics of the data during writing operation so as to program the frequently-read data into the physical programming unit with faster reading speed. As a result, the reading performance can be effectively improved.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9 is an example illustrating a read count table according to an exemplary embodiment of the invention.

FIG. 10 is an example illustrating execution of write commands according to an exemplary embodiment of the invention.

DESCRIPTION OF THE EMBODIMENTS

Figure 1:
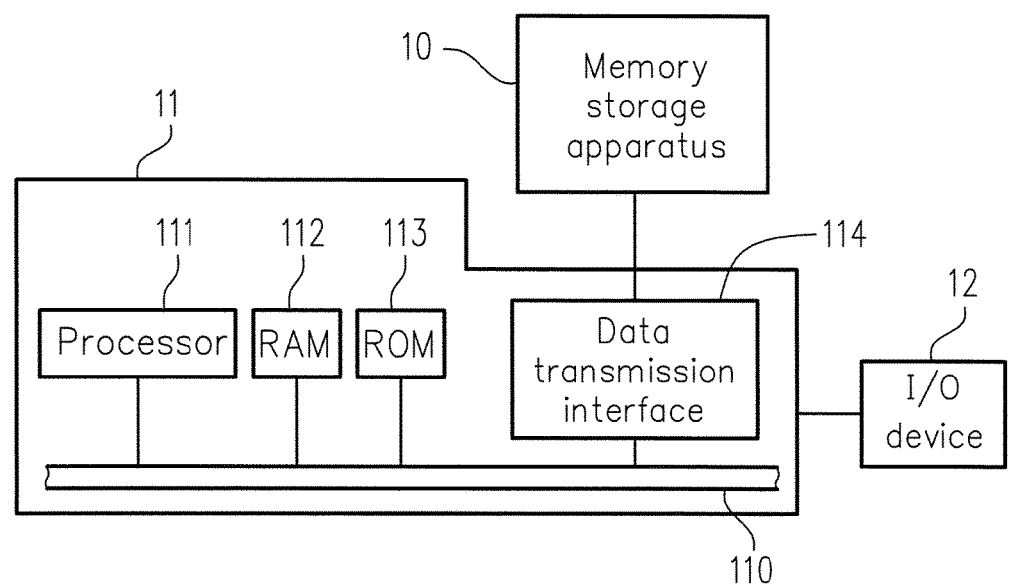
FIG. 1 illustrates a host system and a memory storage apparatus according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (also known as a memory storage system) includes a rewritable non-volatile memory module and a controller (also known as a control circuit unit). The memory storage apparatus is usually configured together with a host system so the host system can write data into the memory storage apparatus or read data from the memory storage apparatus.

Figure 2:
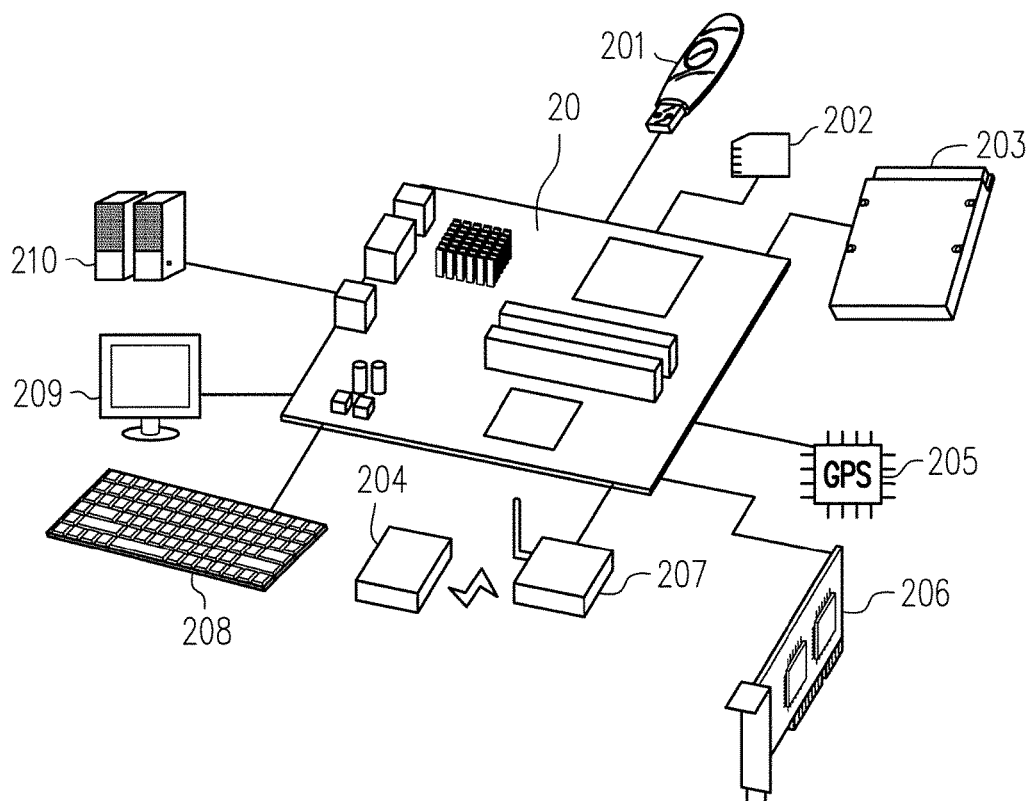
FIG. 2 is a schematic diagram illustrating a computer, an input/output device and a memory storage apparatus according to an exemplary embodiment of the invention.

FIG. 1 is a schematic diagram illustrating a host system, a memory storage apparatus and an input/output (I/O) device according to an exemplary embodiment of the invention, and FIG. 2 is a schematic diagram illustrating a host system, a memory storage apparatus and an input/output (I/O) device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage apparatus 10 through the data transmission interface 114. For example, the host system 11 can write data into the memory storage apparatus 10 or read data from the memory storage apparatus 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage apparatus 10 in a wired manner or a wireless manner. The memory storage apparatus 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as a NFC (Near Field Communication Storage) memory storage apparatus, a WiFi (Wireless Fidelity) memory storage apparatus, a Bluetooth memory storage apparatus, a BLE (Bluetooth low energy) memory storage apparatus (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage apparatus 204 via the wireless transmission device 207.

Figure 3:
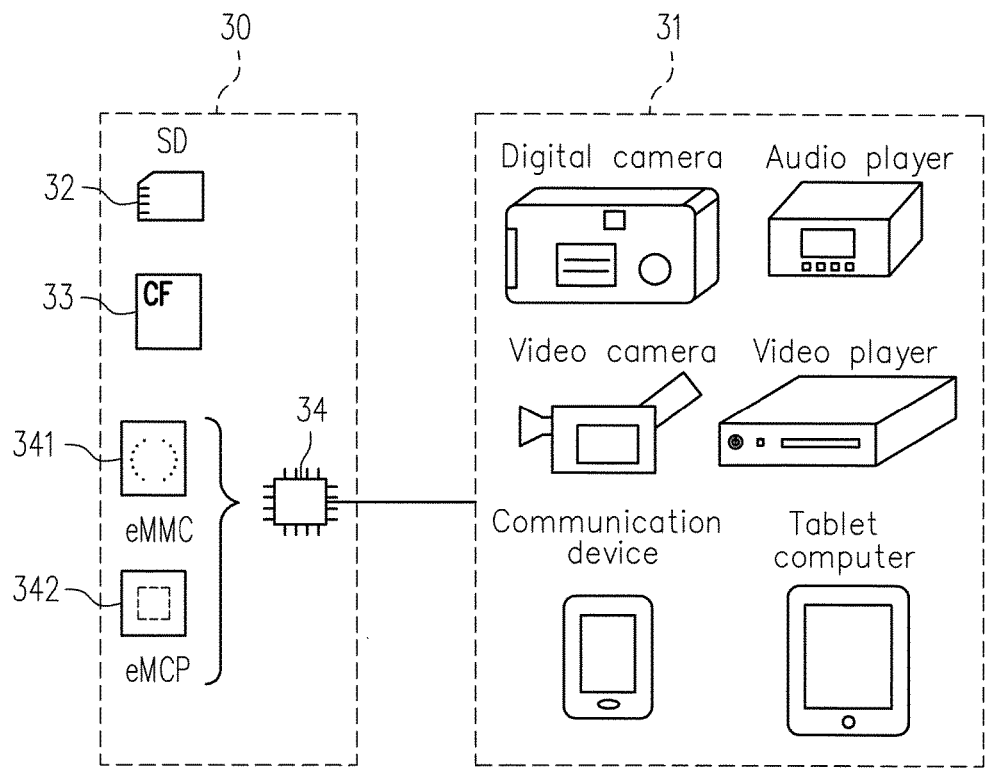
FIG. 3 is a schematic diagram of a host system and a memory storage apparatus according to an exemplary embodiment of the invention.

In an exemplary embodiment, aforementioned host system may be any system capable of substantially cooperating with the memory storage apparatus for storing data. Although the host system is illustrated as a computer system in the foregoing exemplary embodiments, nonetheless, FIG. 3 is a schematic diagram illustrating a host system and a memory storage apparatus according to another exemplary embodiment of the invention. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory storage apparatuses used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
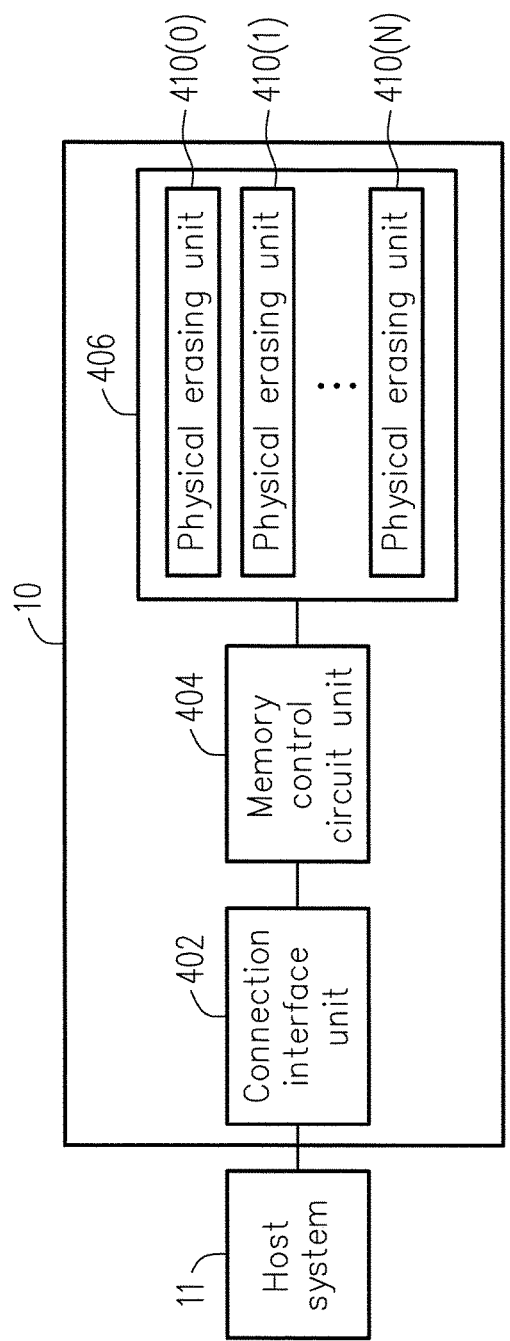
FIG. 4 is a schematic block diagram illustrating a memory storage apparatus according to an exemplary embodiment of the invention.

FIG. 4 is a schematic block diagram illustrating a host system and a memory storage apparatus according to an exemplary embodiment of the invention.

Referring to FIG. 4, the memory storage apparatus 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited the above. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a SD (Secure Digital) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory storage module 406 includes physical erasing units 410(0) to 410(N). For example, the physical erasing units 410(0) to 410(N) may belong to the same memory die or belong to different memory dies. Each physical erasing unit has a plurality of physical programming units, and the physical programming units of the same physical erasing unit may be written separately and erased simultaneously. Nevertheless, it should be understood that the invention is not limited the above. Each physical erasing unit may be constituted by 64 physical programming units, 256 physical programming units or any number of the physical programming units.

More specifically, the physical erasing unit is a minimum unit for erasing. Namely, each physical erasing unit contains the least number of memory cells to be erased together. The physical programming unit is the minimum unit for programming. That is, the physical programming unit is the minimum unit for writing data. Each physical programming unit usually includes a data bit area and a redundant bit area. The data bit area includes multiple physical access addresses and is used to store user data, and the redundant bit area is used to store system data (e.g., control information and error checking and connecting code). In the present exemplary embodiment, each data bit area of the physical programming unit contains 8 physical access addresses, and the size of each physical access address is 512 byte. However, in other exemplary embodiments, the data bit area may also contain more or less physical access addresses, and the number and size of the physical access addresses are not limited by the invention. For example, in an exemplary embodiment, the physical erasing unit is a physical block, and the physical programming unit is a physical page or a physical sector, but the invention is not limited thereto.

In the present exemplary embodiment, the rewritable non-volatile memory module 406 is a TLC (Trinary Level Cell) NAND flash memory module (i.e., a flash memory module capable of storing three data bits in one memory cell). However, the invention is not limited to the above. The rewritable non-volatile memory module 406 may also be a Multi Level Cell (MLC) NAND flash memory module (i.e., a flash memory module capable of storing two data bits in one memory cell) or other memory module having the same features.

Figures 5A, 5B:
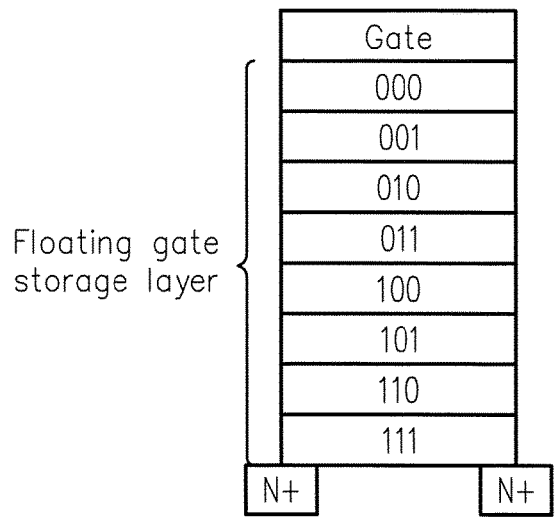
FIG. 5A and FIG. 5B are schematic diagrams illustrating a memory cell storage structure and a physical erasing unit according to an exemplary embodiment of the invention.

FIG. 5A and FIG. 5B are schematic diagrams illustrating a memory cell storage structure and a physical erasing unit according to an exemplary embodiment of the invention.

Referring to FIG. 5A, the storage states of each memory cell in the rewritable non-volatile memory module 406 can be identified as "111", "110", "101", "100", "011", "010", "001" or "000" (as shown in FIG. 5A). The first bit counted from the left side of the storage states is the LSB, the second bit counted from the left side of the storage states is the CSB and the third bit counted from the left side of the storage states is the MSB. In addition, the memory cells arranged on the same word line can constitute three physical programming units. Here, the physical programming unit constituted by the LSBs of said memory cells is known as a first physical programming unit (a.k.a. the lower physical programming unit), the physical programming unit constituted by the MSBs of said memory cells is known as a second physical programming unit (a.k.a. the upper physical programming unit), and the physical programming unit constituted by the CSBs of said memory cells is known as a third physical programming unit (a.k.a. the middle physical programming unit).

Referring to FIG. 5B, one physical erasing unit is constituted by a plurality of physical programming unit groups. Each of the physical programming unit groups includes the lower physical programming unit, the middle physical programming unit and the upper physical programming unit constituted by multiple memory cells arranged on the same word line. For example, in a physical erasing unit, the 0-th physical programming unit belonging to the lower physical programming unit, the 1-st physical programming unit belonging to the middle physical erasing unit and the 2-nd physical programming unit belonging to the upper physical programming unit are regarded as one physical programming unit group. Similarly, the 3-rd, the 4-th, and the 5-th physical programming units are regarded as one physical programming unit group, and by analogy, the other physical programming units are also grouped into multiple physical programming unit groups by the same method. In other words, in the exemplary embodiment of FIG. 5B, the physical erasing unit includes 258 physical programming units in total, and the lower physical programming unit, the middle physical programming unit and the upper physical programming unit constituted by multiple memory cells arranged on the same word line can constitute one physical programming unit group. Therefore, the physical erasing unit of FIG. 5B may be classified into 86 physical programming unit groups in total. However, it should be noted that, the invention is not intended to limit the numbers of the physical programming unit or the physical programming unit groups in the physical erasing unit.

It is noted that, in the present exemplary embodiment, a speed for reading data from the lower physical programming unit is faster than a speed for reading data from the middle physical programming unit and a speed for reading data from the upper physical programming unit.

Figure 6:
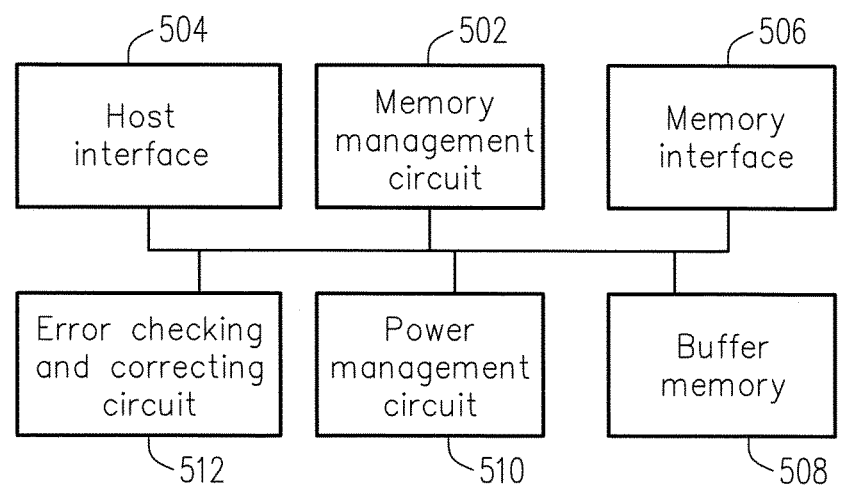
FIG. 6 is a schematic block diagram illustrating a memory control circuit unit according to an exemplary embodiment of the invention.

FIG. 6 is a schematic block diagram illustrating a memory control circuit unit according to an exemplary embodiment of the invention.

Referring to FIG. 6, the memory control circuit unit 404 includes a memory management circuit 502, a host interface 504, a memory interface 506, a buffer memory 508, a power management circuit 510, and an error checking and correcting circuit 512.

The memory management circuit 502 is configured to control overall operations of the memory control circuit unit 404. Specifically, the memory management circuit 502 has a plurality of control commands and the control commands are executed to execute various operations such as writing, reading and erasing data during operation of the memory storage apparatus 10.

In the present exemplary embodiment, the control commands of the memory management circuit 502 are implemented in form of firmware. For instance, the memory management circuit 502 has a microprocessor unit (not illustrated) and a read-only memory (not illustrated), and the control commands are burnt into the read-only memory. During operation of the memory storage apparatus 10, the control commands are executed by the microprocessor to perform operations of writing, reading or erasing data.

Figure 7:
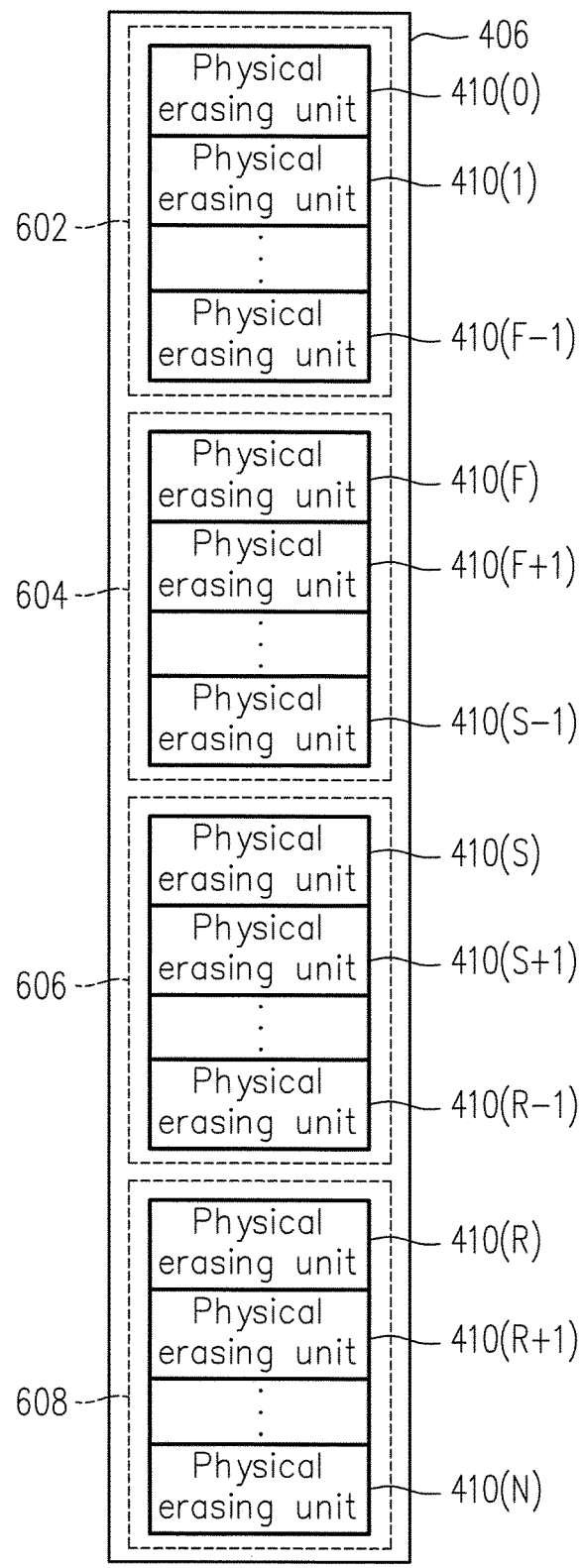
FIG. 7 and FIG. 8 are schematic diagrams illustrating a management of physical blocks according to a first exemplary embodiment of the invention.
Figure 8:
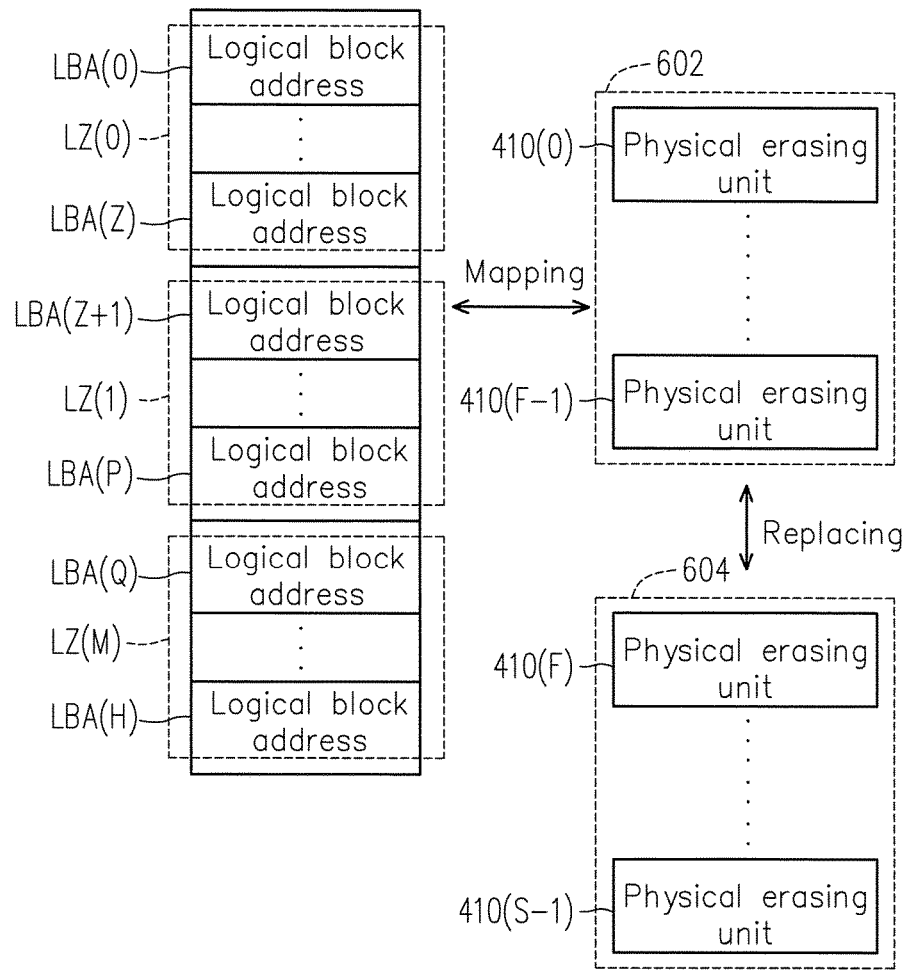

FIG. 7 and FIG. 8 are schematic diagrams illustrating a management of the physical erasing units according to an exemplary embodiment of the invention.

It should be understood that terms, such as "retrieve", "group", "classify", "associate" and so forth, are logical concepts which describe operations in the physical erasing units of the rewritable non-volatile memory module 406. In other words, the physical erasing units of the rewritable non-volatile memory module are logically operated so actual positions of the physical units of the rewritable non-volatile memory module are not changed.

Referring to FIG. 7, the memory control circuit unit 404 (or the memory management circuit 502) may logically group the physical erasing units 410(0) to 410(N) into a data area 602, a spare area 604, a system area 606 and a replacement area 608.

The physical erasing units logically belonging to the data area 602 and the spare area 604 are configured to store data from the host system 11. More specifically, the physical erasing units of the data area 602 are regarded as the physical erasing units stored with the data, whereas the physical erasing units of the spare area 604 are configured to replace the physical erasing units of the data area 602. In other words, when the write command and the data to be written are received from the host system 11, the memory control circuit unit 404 (or the memory management unit 502) uses the physical erasing units retrieved from the spare area 604 as replacement to the physical erasing units in the data area 602 for writing data.

The physical erasing units logically belonging to the system area 606 are configured to record system data. For example, the system data includes information related to manufacturer and model of the rewritable non-volatile memory module, a number of physical erasing units in the rewritable non-volatile memory module, a number of the physical programming units in each physical erasing unit, and so forth.

The physical erasing units logically belonging to the replacement area 608 are used in a bad physical erasing unit replacement procedure for replacing damaged physical erasing units. More specifically, if there are still usable physical erasing units available in the replacement area 608 when the physical erasing units of the data area 602 are damaged, the memory control circuit unit 404 (or the memory management unit 502) can retrieve the usable physical erasing units from the replacement area 608 for replacing the damaged physical erasing units.

In particular, the numbers of the physical erasing units in the data area 602, the spare area 604, the system area 606 and the replacement area 608 may be different from one another according to the different memory specifications. In addition, it should be understood that, during operation of the memory storage apparatus 10, grouping relations of the physical erasing units for associating with the data area 602, the spare area 604, the system area 606, and the replacement area 608 may be dynamically changed. For example, when the damaged physical erasing units in the spare area 604 are replaced by the physical erasing units in the replacement area 608, the physical erasing units originally from the replacement area 608 are then associated with the spare area 604.

Referring to FIG. 8, the memory control circuit unit 404 (or the memory management circuit 502) assigns logical block addresses LBA(0) to LBA(H) for mapping to the physical erasing units of the data area 602. Each of the logical block addresses includes a plurality of logical addresses for mapping to the corresponding physical programming units of the physical erasing units. When the host system 11 intends to write the data into the logical addresses or update the data stored in the logical addresses, the memory control circuit unit 404 (or the memory management unit 502) retrieves one physical erasing unit from the spare area 604 as an active physical erasing unit to alternate the physical erasing units of the data area 602 for writing data. Further, when the physical erasing unit serving as the active physical erasing unit is fully written, the memory control circuit unit 404 (or the memory management circuit 502) can again retrieve an empty physical erasing unit from the spare area 604 as the active physical erasing unit to continue writing data corresponding to the write command from the host system 11. Further, when a number of the avaliable physical erasing units in the spare area 604 is less than a preset value, the memory control circuit unit 404 (or the memory management circuit 502) can perform a garbage collection operation (also known as a valid data collection operation) to arrange the valid data in the data area 602, so as to re-associate the physical erasing units in the data area 602 not storing the valid data to the spare area 604.

In order to identify which of the physical programming units is data in each of the logical addresses being stored to, the memory control circuit unit 404 (or the memory management circuit 502) can record the mapping relations between the logical addresses and the physical programming units. For example, in the present exemplary embodiment, the memory control circuit unit 404 (or the memory management circuit 502) stores a logical-physical mapping table in the rewritable non-volatile memory module 406 for recording the physical programming unit mapped by each of the logical addresses. When intending to access data, the memory control circuit unit 404 (or the memory management circuit 502) loads the logical-physical mapping table into the buffer memory 508 for maintenance and writes or reads data according to the logical-physical mapping table.

It is worth mentioning that, the buffer memory 508 is unable to store the mapping table recording the mapping relations of all the logical addresses due to limited capacity. Therefore, in the present exemplary embodiment, the memory control circuit unit 404 (or the memory management unit 502) groups the logical block addresses LBA(0) to LBA(H) into a plurality of logical zones LZ(0) to LZ(M), and configures one logical-physical mapping table for each of the logical zones. In particular, when the memory control circuit unit 404 (or the memory management unit 502) intends to update a mapping of one specific logical block address, the logical-physical table corresponding to the logical zone to which the specific logical block address belongs is loaded into the buffer memory 508 for updating. Specifically, if the logical-physical mapping table corresponding to the logical zone to which the specific logical block address belongs is not temporarily stored in the buffer memory 508 (i.e., the mapping of the logical block address to be updated is not recorded in the logical-physical mapping table temporarily stored in the buffer memory 508), the memory control circuit unit 404 (or the memory management circuit 502) can perform a mapping table swapping operation to restore the current logical-physical mapping table temporarily stored in the buffer memory 508 back to the rewritable non-volatile memory module 406, and loads the logical-physical mapping table recorded with the mapping of the logical block address to be updated into the buffer memory 508.

In another exemplary embodiment of the invention, the control commands of the memory management circuit 502 may also be stored, in form of program codes, into a specific area (e.g., a system area in the memory module exclusively used for storing the system data) of the rewritable non-volatile memory module 406. In addition, the memory management circuit 502 has a microprocessor unit (not illustrated), a ROM (not illustrated) and a RAM (not illustrated). In particular, the ROM has an activate code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations of writing, reading or erasing data.

Further, in another exemplary embodiment of the invention, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory r circuit, the memory reading circuit, the memory erasing circuit and the data processing circuit are coupled to the microprocessor. The memory cell management circuit is configured to manage the physical erasing units of the rewritable non-volatile memory module 406; the memory writing circuit is configured to give a write command to the rewritable non-volatile memory module 406 in order to write data into the rewritable non-volatile memory module 406; the memory reading circuit is configured to give a read command to the rewritable non-volatile memory module 406 in order to read data from the rewritable non-volatile memory module 406; the memory erasing circuit is configured to give an erase command to the rewritable non-volatile memory module 406 in order to erase data from the rewritable non-volatile memory module 406; and The data processing circuit is configured to process both the data to be written into the rewritable non-volatile memory module 406 and the data read from the rewritable non-volatile memory module 406.

Referring back to FIG. 6, the host interface 504 is coupled to the memory management circuit 502 and configured to couple to the connection interface unit 402, so as to receive and identify commands and data sent from the host system 11. In other words, the commands and data transmitted by the host system 11 are transmitted to the memory management circuit 502 via the host interface 504. In the present exemplary embodiment, the host interface 504 is compatible with the SATA standard. Nevertheless, it should be understood that the invention is not limited to the above. The host interface 504 may also be compatible with he PATA standard, the IEEE 1394 standard, the PCI Express standard, the USB standard, the UHS-I interface standard, the UHS-II interface standard, the SD standard, the MS standard, the MMC standard, the CF standard, the IDE standard, or other suitable standards for data transmission.

The memory interface 506 is coupled to the memory management circuit 502 and configured to access the rewritable non-volatile memory module 406. In other words, the data to be written into the rewritable non-volatile memory module 406 is converted into a format acceptable by the rewritable non-volatile memory module 406 via the memory interface 506.

The buffer memory 508 is coupled to the memory management circuit 502 and configured to temporarily store data and commands from the host system 11 or data from the rewritable non-volatile memory module 406.

The power management unit 510 is coupled to the memory management circuit 502 and configured to control power of the memory storage apparatus 10.

The error checking and correcting circuit 512 is coupled to the memory management circuit 502 and configured to perform an error checking and correcting procedure to ensure the data integrity. For example, when a write command is received by the memory management circuit 502 from the host system 11, the error checking and correcting circuit 512 can generate an ECC code (error checking and correcting code) for data corresponding to the write command so the memory management circuit 502 can write the data and the ECC code corresponding to the write command to the rewritable non-volatile memory module 406. Subsequently, the memory management circuit 502 can read the error checking and correcting code corresponding to the data when reading the data from the rewritable non-volatile memory module 406, and the error checking and correcting circuit 512 can then perform the error checking and correcting procedure for the read data according to the error checking and correcting code.

In the following description, the operations executed by the memory management circuit 502, the host interface 504, the memory interface 506, the buffer memory 508, the power management circuit 510 and the error checking and correcting circuit 512 may also be referred to as being executed by the memory control circuit unit 404.

It is noted that in the following description, some terms may be replaced with corresponding abbreviations for ease of reading (see Table 1).

TABLE 1

| logical-physical mapping table | L2P table |
| rewritable non-volatile memory module | RNVM module |
| physical erasing unit | PEU |
| physical programming unit | PPU |
| memory management circuit | MMC |

In the present exemplary embodiment, when a write command from the host system 11 is to be executed, the MMC 502 identifies data frequently read (a.k.a. frequently-read data) according to characteristic parameters corresponding to the data to be written, and programs the frequently-read data into the lower PPU. Here, the frequently-read data refer to data read more frequently than the other data (a.k.a. non-frequently-read data), as reflected according to the characteristic parameters. For example, the MMC 502 arranges the data according to the characteristic parameters corresponding to the data to be written, and generates a writing sequence corresponding to the data. Then, a command sequence is given according to the writing sequence so as to program the arranged data into the RNVM module 406.

For example, in the present exemplary embodiment, the MMC 502 establishes a read count table to record a read count for each logical address, and uses the read counts of the logical addresses storing the data as the characteristic parameters of the data. In other words, the MMC 502 arranges data to be stored according to the read count of each logical address storing the data so as to generate the corresponding writing sequence, and programs the data into the RNVM module 406 according to the writing sequence.

FIG. 9 is an example illustrating a read count table according to an exemplary embodiment of the invention.

With reference to FIG. 9, a read count table 900 includes a logical address field 901 and a read count field 902. The logical address field 901 records a serial number for each logical address, and the read count field 902 records the read counts corresponding to the logical addresses. For example, each time when the host system 11 gives the read command for one logical address, the read count corresponding to such logical address is added by one. In the present exemplary embodiment, after the memory storage apparatus 10 is powered up, the MMC 502 loads the read count table 900 from the RNVM module 406 and updates the read count table 900 according to the read command given by the host system 11; and before the memory storage apparatus 10 is powered off, the MMC 502 stores the read count table 900 back to the RNVM module 406. For example, the read count table 900 is stored in the system area 606.

It should be understood that, although the read counts of the logical addresses are used as the characteristic parameters corresponding to the data, the invention is not limited thereto. In another exemplary embodiment, reading frequencies and/or reading time intervals of the logical addresses may also be used as the characteristic parameters corresponding to the data.

In the present exemplary embodiment, when the memory storage apparatus 10 receives the write command and the data to be stored from the host system 11, the MMC 502 temporarily stores the data into the buffer memory 508. Subsequently, the memory storage apparatus 10 obtains the corresponding read counts from the read count table 900 according to the logical addresses instructed by the write command, and sorts the data to be stored according to the obtained read counts. In particular, according to the sorted sequence, data stored the logical address with higher read count is programmed into the lower PPU. In this way, when the read command is to be executed, a speed for reading data from frequently read logical addresses can be significantly increased so a time for executing the read command can be reduced.

FIG. 10 is an example illustrating execution of write commands according to an exemplary embodiment of the invention.

With reference to FIG. 10, it is assumed that the memory storage apparatus 10 receives one (or more) write command from the host system 11, and the write command instructs to store data D0 to the logical address LA0, store data D1 to the logical address LA1, store data D2 to a logical address LA2, store data D3 to a logical address LA3, store data D4 to a logical address LA4 and store data D5 to a logical address LA5 in sequence.

In this example, the MMC 502 first temporarily stores the data D0 to D5 into the buffer memory 508, and obtains the read counts of the logical addresses LA0 to LA5 from the read count table 900 according to the write command. As shown in FIG. 9, the read count of the logical address LA0 is 0, the read count of the logical address LA1 is 5, the read count of the logical address LA2 is 300, the read count of the logical address LA3 is 10, the read count of the logical address LA4 is 20 and the read count of the logical address LA5 is 10. Accordingly, the MMC 502 adjusts a sequence of the originally received write command (i.e., the logical address LA0, the logical address LA1, the logical address LA2, the logical address LA3, the logical address LA4, the logical address LA5) into a new write sequence (i.e., the logical address LA2, the logical address LA3, the logical address LA0, the logical address LA4, the logical address LA5, the logical address LAI). Then, the MMC 502 retrieves one PEU (e.g., the PEU 410(F), also referred to as a first PEU hereinafter) from the spare area 604, and programs the data D2 (also referred to as first data hereinafter) into an 0-th PPU of the PEU 410(F), programs the data D3 into a 1-st PPU at the PEU 410(F) and programs the data D0 (also referred to as second data hereinafter) stored the logical address into a 2-nd PPU in the PEU 410(F) in sequence. Here, the 0-th to 2-nd PPUs may also be referred to as a first PPU group. Next, the MMC 502 programs the data D4 into a 3-rd PPU in the PEU 410(F), programs the data D5 into a 4-th PPU in the PEU 410(F), and programs the data D1 into a 5-th PPU in the PEU 410(F). Here, the 3-rd to 5-th PPUs may also be referred to as the first PPU group. In other words, in this example, according to the read counts of the logical addresses from greatest to least, the data D2 and the data D4 stored in the two logical addresses having the greatest read counts are programmed into the lower PPUs, the data D3 and the data D5 stored in the two logical addresses having the second greatest read counts are programmed into the middle PPUs, and the data D0 and the data D1 stored in the two logical addresses having the smaller read counts are programmed into the upper PPUs.

According to the example of FIG. 10, the data identified as frequently read and the other data are programmed together into the same PPU group. However, the invention is not limited thereto. In another exemplary embodiment, the MMC 502 may also program the data D2 and data D4 into the PPU group by using a single level mode (SLC mode), a lower PPU programming mode or a mixture programming mode, and program the data D3, the data D5, the data D0 and the data D1 into the PPU group by using a multiple level mode. Here, if the RNVM module 406 is used in the single level mode, each memory cell stores only one data bit. If the RNVM module 406 is used in the lower physical programming mode, only the PPUs belonging to the lower PPU in the RNVM module 406 are programmed, and the upper PPU corresponding to the lower PPU may not be programmed. If the RNVM module 406 is used in the mixture programming mode, the valid data (or real data) are programmed into the PPUs belonging to the lower PPU without being programmed into the PPUs belonging to the upper PPU. In addition, if the RNVM module 406 is used in mixture programming mode, invalid data (or dummy data) corresponding to the valid data (or real data) are programmed into the PPUs belonging to the upper PPU.

In the example of FIG. 10, the writing sequence of the data to be stored is rearranged when the write command is executed. However, the invention is not limited to the above. When the valid data collection operation is executed, the same method may also be used to program the data read more frequently into the lower PPU.

Figure 11:
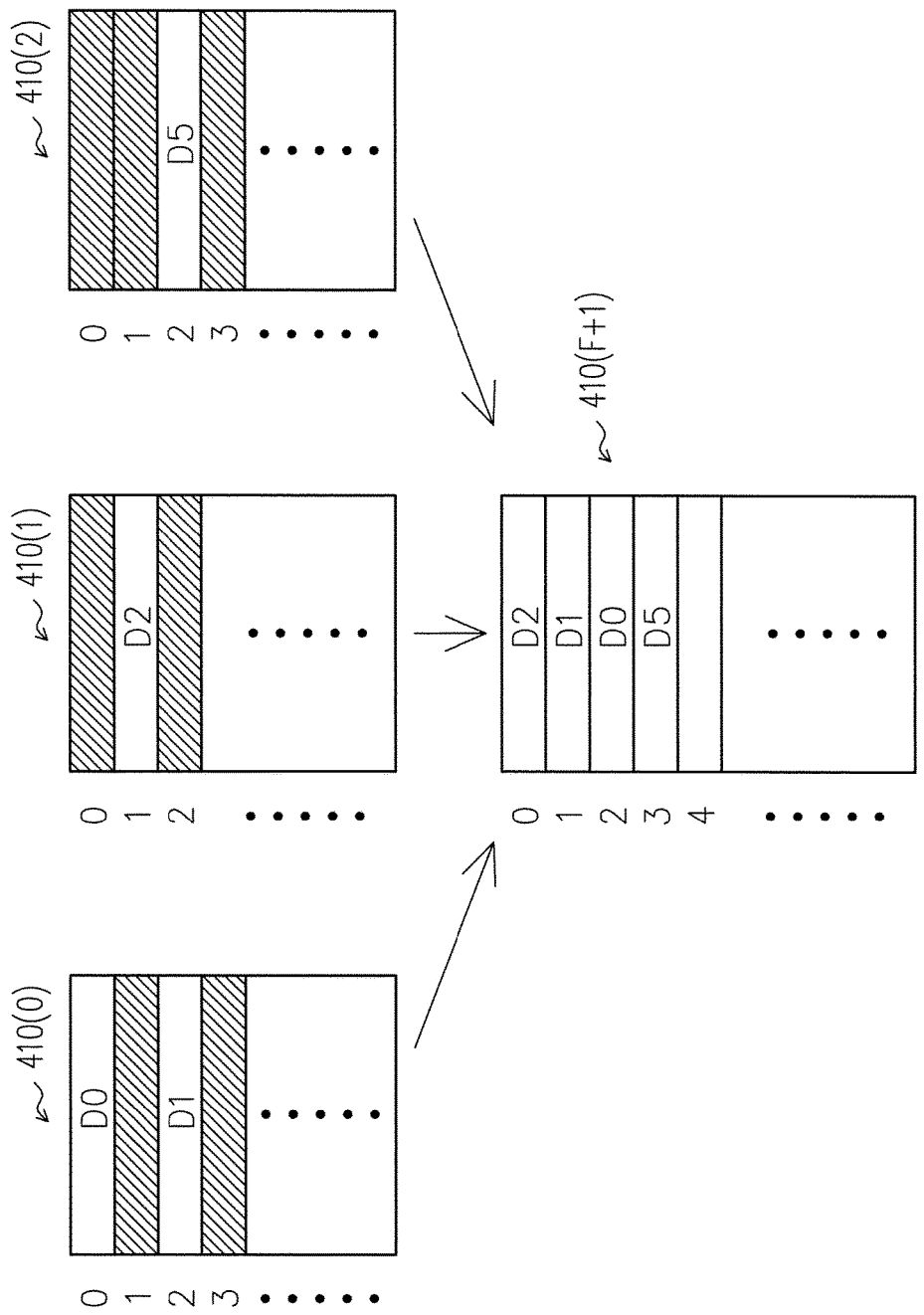
FIG. 11 is an example illustrating a valid data collection operation according to an exemplary embodiment of the invention.

FIG. 11 is an example illustrating a valid data collection operation according to an exemplary embodiment of the invention.

With reference to FIG. 11, it is assumed that the PEU 410(0), the PEU 410(1) and the PEU 410(2) are selected for the valid data collection operation, where the PEU 410(0) stores the valid data D0 belonging to the logical address LA0 and the valid data D1 belonging to the logical address LA1, the PEU 410(1) stores the valid data D2 belonging to the logical address LA2, the PEU 410(2) stores the valid data D5 belonging to the logical address LA5, and dotted line portions in the drawing indicate the invalid data.

In this example, the MMC 502 reads the data D0, D1, D2 and D5 separately from the PEU 410(0), the PEU 410(1) and the PEU 410(2), temporarily stores the data D0, D1, D2 and D5 into the buffer memory 508, and obtains the read counts of the logical addresses LA0, LA1, LA2 and LA5 from the read count table 900 according to the L2P table. As shown in FIG. 9, the read count of the logical address LA0 is 0, the read count of the logical address LA1 is 5, the read count of the logical address LA2 is 300, and the read count of the logical address LA5 is 10. Accordingly, the MMC 502 adjusts a sequence of original read data (i.e., the logical address LA0, the logical address LA1, the logical address LA2, the logical address LA5) into a new wiring sequence (i.e., the logical address LA2, the logical address LA1, the logical address LA0, the logical address LA5). Then, the MMC 502 retrieves one PEU (e.g., the PEU 410(F+1)) from the spare area 604, and programs the data D2 into an 0-th PPU of the PEU 410(F), programs the data D1 into a 1-st PPU of the PEU 410(F), programs the data D0 into a 2-nd PPU of the PEU 410(F), and programs the data D5 into a 3-rd PPU of the PEU 410(F) in sequence. In other words, in this example, according to the read counts of the logical addresses from greatest to least, the data D2 and the data D5 stored in the two logical addresses having the greatest read counts are programmed into the lower PPUs, the data D1 stored in the logical address having the second greatest read count is programmed into the middle PPU, and the data D0 stored in the logical address having the smaller read count is programmed into the upper PPU.

In the example of FIG. 10 and FIG. 11, by adjusting the sequence for writing data according to the characteristic parameters corresponding to the data (the read counts of the logical addresses) before the data are programmed to program the frequently-read data into the lower PPU with faster reading speed, the time for executing the read command can be effectively reduced.

It should be understood that, in the example shown by FIG. 10 and FIG. 11, the writing sequence is adjusted in sequence directly according to the read counts of the logical addresses when the write command and the valid data collection operation are executed, so as to program the frequently-read data into the lower PPU with faster reading speed. However, in another exemplary embodiment, the MMC 502 may also identify the corresponding data as the frequently-read data and adjust the writing sequence (only) when the read count of the corresponding logical address is greater than a read count threshold, so as to program the data into the lower PPU with faster reading speed.

Moreover, although the MMC 502 adjusts the writing sequence according to the read counts of the logical addresses in sequence in the example of FIG. 10 and FIG. 11, the invention is not limited thereto. In another exemplary embodiment, the MMC 502 may identify only the frequently-read data and programs such data into the lower PPU with faster reading speed without sorting the other non-frequently-read data altogether according to the read counts of the logical addresses. In other words, when the data to be written is identified as the non-frequently-read data, the MMC 502 can program such data into the upper PPU, the middle PPU or the lower PPU. For example, if the frequently-read data is being identified and the PPU predetermined for programming is not the lower PPU, the MMC 502 then programs the data identified as frequently read into the next adjacent lower PPU and fills said PPU predetermined for programming with the dummy data.

Figure 12:
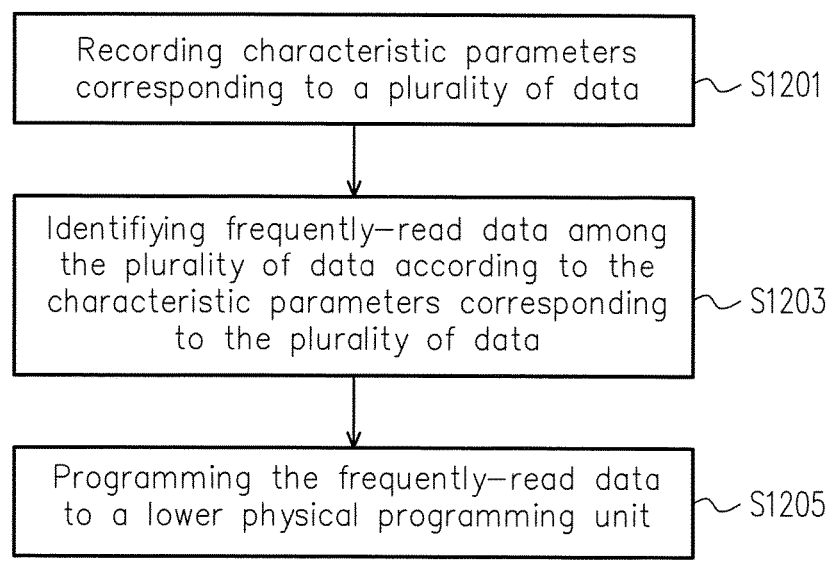
FIG. 12 is a flowchart illustrating a data writing method according to an exemplary embodiment of the invention.

FIG. 12 is a flowchart illustrating a data writing method according to an exemplary embodiment of the invention.

With reference to FIG. 12, when a plurality of data is to be programmed, in step S1201, the MMC 502 records characteristic parameters corresponding to the plurality of data. As described above, for example, the MMC 502 establishes the read count table 900 for recording read counts of logical addresses and uses the read counts of the logical addresses as the characteristic parameters corresponding to the plurality of data.

In step S1203, frequently-read data among the plurality of data are identified according to the characteristic parameters corresponding to the plurality of data. Further, n step S1205, the MMC 502 programs the data identified as frequently read into the lower PPU.

In summary, with he data writing method, the memory control circuit unit and the memory storage apparatus described in the exemplary embodiments of the invention, the sequence for writing data is re-arranged according to the characteristics of the data so as to program the frequently-read data into the PPU with faster reading speed. As a result, the reading performance can be effectively improved.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method for a rewritable non-volatile memory module, the rewritable non-volatile memory module having a plurality of physical erasing units, each physical erasing unit among the physical erasing units having a plurality of physical programming units, the physical programming units being at least classified to a first physical programming unit and a second physical programming unit, a time for reading data from the first physical programming unit being less than a time for reading data from the second physical programming unit, the data writing method comprising:

recording a plurality of characteristic parameters corresponding to a plurality of data;

identifying first data among the plurality of data as frequently-read data according to the characteristic parameters, wherein the frequently-read data is read more frequently than second data among the plurality of data; and programming the first data into the first physical programming unit of a first physical erasing unit among the physical erasing units.

2. The data writing method according to claim 1, further comprising:

arranging the plurality of data according to the characteristic parameters so as to generate a writing sequence corresponding to the plurality of data; and programming the plurality of data into the first physical erasing unit among the physical erasing units according to the writing sequence.

3. The data writing method according to claim 2, further comprising:

assigning a plurality of logical addresses for mapping to at least part of the physical programming units, wherein the plurality of data is stored in the logical addresses, wherein the step of recording the characteristic parameters corresponding to the plurality of data comprises:

establishing a read count table, and recording a read count for each logical address among the logical addresses in the read count table; and using the read count as the characteristic parameters corresponding to the plurality of data.

4. The data writing method according to claim 3, wherein the step of arranging the plurality of data according to the characteristic parameters so as to generate the writing sequence corresponding to the plurality of data comprises:

obtaining the read count from the read count table; and sorting the logical addresses storing the plurality of data according to the read count so as to generate the writing sequence.

5. The data writing method according to claim 2, further comprising:

selecting from the physical erasing units at least two physical erasing units for executing a valid data collection operation; and reading the plurality of data from the at least two physical erasing units.

6. The data writing method according to claim 3, further comprising:

receiving a plurality of write commands from a host system, wherein the write commands respectively instruct to storing the plurality of data to the logical addresses.

7. The data writing method according to claim 1, further comprising:

programming the second data into a second physical programming unit of the first physical erasing unit, wherein a read count of a logical address storing the first data is greater than a read count of a logical address storing the second data.

8. The data writing method according to claim 7, wherein the step of programming the first data into the first physical programming unit of the first physical erasing unit comprises:

programming the first data into the first physical erasing unit by using a single level cell mode; and the step of programming the second data into the second physical programming unit of the first physical erasing unit comprises programming the second data into the first physical erasing unit by using a multiple level cell mode.

9. The data writing method according to claim 1, wherein the characteristic parameters corresponding to the plurality of data are read counts corresponding to the plurality of data, read frequencies corresponding to the plurality of data or reading time intervals corresponding to the plurality of data.

10. A memory control circuit unit, comprising:
a host interface, configured to couple to a host system;
a memory interface, configured to couple to a rewritable non-volatile memory module, wherein the rewritable non-volatile memory module has a plurality of physical erasing units, each physical erasing unit among the physical erasing units has a plurality of physical programming units, the physical programming units are at least classified to a first physical programming unit and a second physical programming unit, and a time for reading data from the first physical programming unit is less than a time for reading data from the second physical programming unit; and
a memory management circuit, coupled to the host interface and the memory interface,
wherein the memory management circuit is configured to record a plurality of characteristic parameters corresponding to a plurality of data and identify first data among the plurality of data as frequently-read data according to the characteristic parameters, wherein the frequently-read data is read more frequently than second data among the plurality of data,
wherein the memory management circuit is further configured to give at least one command sequence for programming the first data into the first physical programming unit of a first physical erasing unit among the physical erasing units.

11. The memory control circuit unit according to claim 10, wherein the memory management circuit is further configured to arrange the plurality of data according to the characteristic parameters so as to generate a writing sequence corresponding to the plurality of data, and program the plurality of data into the first physical erasing unit among the physical erasing units according to the writing sequence.

12. The memory control circuit unit according to claim 11, wherein the memory management circuit is further configured to assign a plurality of logical addresses for mapping to at least part of the physical programming units, wherein the plurality of data is stored in the logical addresses,
wherein in the operation of recording the characteristic parameters corresponding to the plurality of data, the memory management circuit establishes a read count table, records a read count for each logical address among the logical addresses in the read count table, and uses the read count as the characteristic parameters corresponding to the plurality of data.

13. The memory control circuit unit according to claim 12, wherein in the operation of arranging the plurality of data according to the characteristic parameters so as to generate the writing sequence corresponding to the plurality of data, the memory management circuit obtains the read count from the read count table and sorts the logical addresses storing the plurality of data according to the read count so as to generate the writing sequence.

14. The memory control circuit unit according to claim 11, wherein the memory management circuit is further configured to select from the physical erasing units at least two physical erasing units for executing a valid data collection operation, and read the plurality of data from the at least two physical erasing units.

15. The memory control circuit unit according to claim 12, wherein the memory management circuit is further configured to receive a plurality of write commands from the host system,
wherein the write commands respectively instruct to store the plurality of data to the logical addresses.

16. The memory control circuit unit according to claim 10, wherein the memory management circuit is further configured to program the second data into a second physical programming unit of the first physical erasing unit,
wherein a read count of a logical address storing the first data is greater than a read count of a logical address storing the second data.

17. The memory control circuit unit according to claim 16, wherein the memory management circuit programs the first data into the first physical erasing unit by using a single level cell mode, and programs the second data into the first physical erasing unit by using a multiple level cell mode.

18. The memory control circuit unit according to claim 10, wherein the characteristic parameters corresponding to the plurality of data are read counts corresponding to the plurality of data, read frequencies corresponding to the plurality of data or reading time intervals corresponding to the plurality of data.

19. A memory storage apparatus, comprising:
a connection interface unit, configured to couple to a host system;
a rewritable non-volatile memory module, wherein the rewritable non-volatile memory module has a plurality of physical erasing units, each physical erasing unit among the physical erasing units has a plurality of physical programming units, the physical programming units are at least classified to a first physical programming unit and a second physical programming unit, and a time for reading data from the first physical programming unit is less than a time for reading data from the second physical programming unit; and
a memory control circuit unit, coupled to the connection interface unit and the rewritable non-volatile memory module,
wherein the memory control circuit unit is configured to record a plurality of characteristic parameters corresponding to a plurality of data and identify first data among the plurality of data as frequently-read data according to the characteristic parameters, wherein the frequently-read data is read more frequently than second data among the plurality of data,
wherein the memory control circuit unit is further configured to program the first data into the first physical programming unit of a first physical erasing unit among the physical erasing units.

20. The memory storage apparatus according to claim 19, wherein the memory control circuit unit is further configured to arrange the plurality of data according to the characteristic parameters so as to generate a writing sequence corresponding to the plurality of data, and program the plurality of data into the first physical erasing unit among the physical erasing units according to the writing sequence.

21. The memory storage apparatus according to claim 20, wherein the memory control circuit unit is further configured to assign a plurality of logical addresses for mapping to at least part of the physical programming units, wherein the plurality of data is stored in the logical addresses, wherein in the operation of recording the characteristic parameters corresponding to the plurality of data, the memory control circuit unit establishes a read count table, records a read count for each logical address among the logical addresses in the read count table, and uses the read count as the characteristic parameters corresponding to the plurality of data.

22. The memory storage apparatus according to claim 21, wherein in the operation of arranging the plurality of data according to the characteristic parameters so as to generate the writing sequence corresponding to the plurality of data, the memory control circuit unit obtains the read count from the read count table, and sorts the logical addresses storing the plurality of data according to the read count so as to generate the writing sequence.

23. The memory storage apparatus according to claim 20, wherein the memory control circuit unit is further configured to select from the physical erasing units at least two physical erasing units for executing a valid data collection operation, and read the plurality of data from the at least two physical erasing units.

24. The memory storage apparatus according to claim 21, wherein the memory control circuit unit is further configured to receive a plurality of write commands from the host system, wherein the write commands respectively instruct to store the plurality of data to the logical addresses.

25. The memory storage apparatus according to claim 19, wherein the memory control circuit unit is further configured to program the second data into a second physical programming unit of the first physical erasing unit, wherein a read count of a logical address storing the first data is greater than a read count of a logical address storing the second data.

26. The memory storage apparatus according to claim 25, wherein the memory control circuit unit programs the first data into the first physical erasing unit by using a single level cell mode, and programs the second data into the first physical erasing unit by using a multiple level cell mode.

27. The memory storage apparatus according to claim 19, wherein the characteristic parameters corresponding to the plurality of data are read counts corresponding to the plurality of data, read frequencies corresponding to the plurality of data or reading time intervals corresponding to the plurality of data.

* * * * *